(12) United States Patent
Kanou et al.

(10) Patent No.: US 11,387,660 B2
(45) Date of Patent: Jul. 12, 2022

(54) AUTOMATIC CHARGER (71) Applicant: FDK CORPORATION, Tokyo (JP)

(72) Inventors: Takashi Kanou, Tokyo (JP); Kenji Kitamura, Tokyo (JP); Yasunari Mizoguchi, Tokyo (JP); Kunihisa Sekiguchi, Tokyo (JP)

(73) Assignee: FDK CORPORATION, Tokyo (JP)

( * ) Notice: Subject to any disclaimer, the term of this patent is extended or adjusted under 35 U.S.C. 154(b) by 128 days.

(21) Appl. No.: 17/045,906

(22) PCT Filed: Apr. 10, 2019

(86) PCT No.: PCT/JP2019/015563
§ 371 (c)(1),
(2) Date: Oct. 7, 2020

(87) PCT Pub. No.: WO2019/203081
PCT Pub. Date: Oct. 24, 2019

(65) Prior Publication Data
US 2021/0036530 A1   Feb. 4, 2021

(30) Foreign Application Priority Data

Apr. 19, 2018   (JP) ............................. JP2018-080748

(51) Int. Cl.
*H02J 7/00* (2006.01)
*G01R 31/389* (2019.01)
(Continued)

(52) U.S. Cl.
CPC ........ *H02J 7/00047* (2020.01); *G01R 31/389* (2019.01); *G01R 31/396* (2019.01);
(Continued)

(58) Field of Classification Search
CPC .. H02J 7/0003; H02J 7/00032; H02J 7/00034; H02J 7/00036; H02J 7/00038;
(Continued)

(56) References Cited

U.S. PATENT DOCUMENTS

| 5,694,019 A | 12/1997 | Uchida et al. |
| 5,744,933 A * | 4/1998 | Inoue .................. G06Q 20/127 |
| | | 320/148 |
| 2010/0201307 A1 * | 8/2010 | Poisner ................. H02J 7/0045 |
| | | 320/160 |

FOREIGN PATENT DOCUMENTS

| JP | S61-501289 A | 6/1986 |
| JP | 3141679 U | 5/2008 |
| JP | 2015-524245 A | 8/2015 |

OTHER PUBLICATIONS

International Search Report and Written Opinion dated May 28, 2019, for corresponding PCT Application No. PCT/JP2019/015563.
(Continued)

*Primary Examiner* — Richard Isla
*Assistant Examiner* — Mohammed J Sharief
(74) *Attorney, Agent, or Firm* — Kinney & Lange, P.A.

(57) ABSTRACT

A sorting mechanism includes a flap that selects a first path connecting from a battery outlet of a charging section to a battery inlet of a first compartment section as a path to introduce a first battery to the first compartment section in a case of housing the first battery in the first compartment section, and that selects a second path connecting from the battery outlet of the charging section to a battery inlet of a second compartment section as a path to introduce a second battery to the second compartment section in a case of housing the second battery in the second compartment section.

7 Claims, 3 Drawing Sheets

(51) Int. Cl.
 *G01R 31/396* (2019.01)
 *H01M 10/44* (2006.01)
(52) U.S. Cl.
 CPC ........... *H01M 10/441* (2013.01); *H02J 7/005* (2020.01); *H02J 7/0013* (2013.01); *H02J 7/0045* (2013.01); *H02J 7/0048* (2020.01)
(58) Field of Classification Search
 CPC .. H02J 7/00045; H02J 7/00047; H02J 7/0048; H02J 7/005; H02J 7/0013; H02J 7/0042; H02J 7/0044; H02J 7/0045; G01R 31/389; G01R 31/396; H01M 10/441; H04B 1/3877; H04B 1/3883
 USPC .................................. 320/106, 113, 114, 115
 See application file for complete search history.

(56) References Cited

OTHER PUBLICATIONS

Extended European Search Report dated Jan. 25, 2022, received for corresponding European Application No. 19788321.8, pp. 7.

\* cited by examiner

AUTOMATIC CHARGER

CROSS-REFERENCE TO RELATED APPLICATION(S)

This application is the national phase of PCT Application No. PCT/JP2019/015563 filed on Apr. 10, 2019, which in turn claims priority to Japanese Application No. 2018-080748 filed on Apr. 19, 2018, the disclosures of which are incorporated herein by reference in their entireties.

BACKGROUND

Technical Field

The present disclosure relates to an automatic charger that charges a battery.

Background Art

A charger capable of distinguishing a type of battery, such as a primary battery or a secondary battery, or a size or the like of the battery is known as a generally available charger. This charger can prevent a charging operation from being accidentally performed to the primary battery. Furthermore, as the above charger, a charger is known that is capable of distinguishing whether a battery is a good product, a bad product or a reached the end-of-life (EOL) battery. This charger can notify a user of presence of the bad product or the EOL battery.

Additionally, in the above charger, one battery compartment that houses batteries is only installed. Consequently, even if the charger distinguishes the type of battery, the bad product or the EOL battery as described above, the batteries are mixed and housed in the battery compartment. This causes a problem that a user side has to sort the battery in a case of taking the battery from the charger.

PRIOR ART DOCUMENT

Patent Document

Patent Document 1: Japanese Translation of PCT International Application Publication No. 2015-524245

SUMMARY

The present disclosure has been developed in view of such situations, and an object of the present disclosure is to provide an automatic charger that can prevent batteries, distinguished in terms of charging possibilities and good or bad properties, from being mixed and housed, and that can sort the batteries without relying on user's judgment.

In order to achieve the above object, an automatic charger according to an embodiment of the present disclosure comprises a battery throwing section into which a plurality of batteries are thrown, a charging section that executes a charging operation to the plurality of batteries thrown into the battery throwing section, a detecting section that detects a state of each of the plurality of batteries that are targets of the charging operation by the charging section, a processing unit that distinguishes a first battery satisfying predetermined charging properties, and a second battery other than the first battery, based on a detection result of each of the plurality of batteries by the detecting section, and a battery compartment including a first compartment section that houses the first battery, a second compartment section that houses the second battery, and a sorting mechanism that introduces the first battery to the first compartment section, and introduces the second battery to the second compartment section, in accordance with a distinguishing result of each of the plurality of batteries in the processing unit. The sorting mechanism includes a flap that selects a first path connecting from a battery outlet of the charging section to a battery inlet of the first compartment section as a path to introduce the first battery to the first compartment section in a case of housing the first battery in the first compartment section, and that selects a second path connecting from the battery outlet of the charging section to a battery inlet of the second compartment section as a path to introduce the second battery to the second compartment section in a case of housing the second battery in the second compartment section.

According to the above configuration, the processing unit of the automatic charger according to the present embodiment distinguishes the first battery and the second battery. Furthermore, the battery compartment houses the first battery in the first compartment section, and houses the second battery in the second compartment section, in accordance with the distinguishing result of each of the plurality of batteries in the processing unit. Consequently, the automatic charger according to the present embodiment can automatically distinguish the first battery and the second battery, and separately house the first battery and the second battery.

An automatic charger according to an embodiment of the present disclosure can prevent a first battery and a second battery, distinguished in terms of charging possibilities and good or bad properties, from being mixed and housed, and can sort the batteries without relying on user's judgment. Furthermore, the automatic charger according to the present embodiment separately houses the first battery and the second battery, and hence a user side does not have to sort the batteries, which can improve user's convenience. Furthermore, since the automatic charger according to the present embodiment separately houses the first battery and the second battery, misuse of the batteries is eliminated. Additionally, the automatic charger according to the present embodiment separately houses the first battery and the second battery, which can encourage, for example, positive use of the first battery. This can increase use frequency of the first battery, save energy and also contribute to environments.

BRIEF DESCRIPTION OF THE DRAWINGS

The present disclosure will become more fully understood from the detailed description given hereinafter and the accompanying drawings which are given by way of illustration only, and thus, are not limitative of the present disclosure, and wherein.

DETAILED DESCRIPTION

Figure 1:
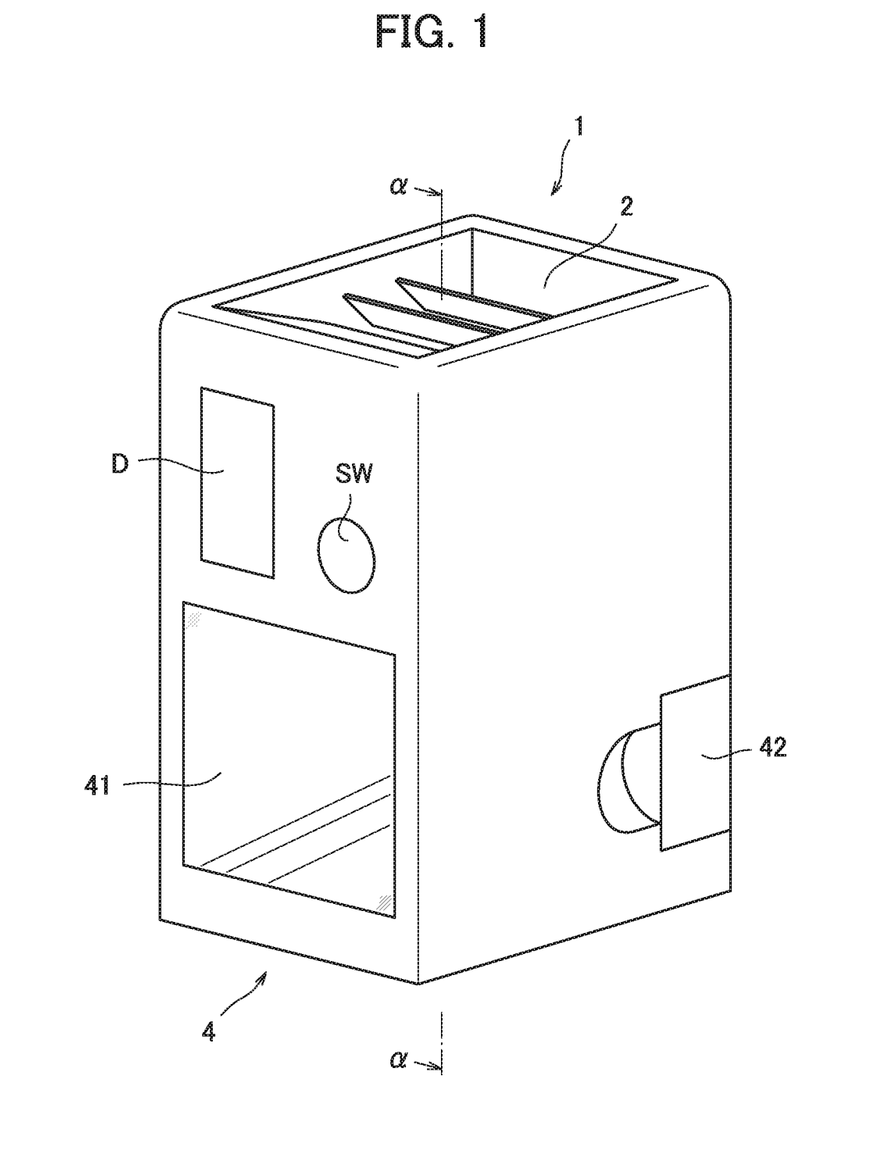
FIG. 1 is an appearance view of an automatic charger according to an embodiment of the present disclosure.
Figure 2:
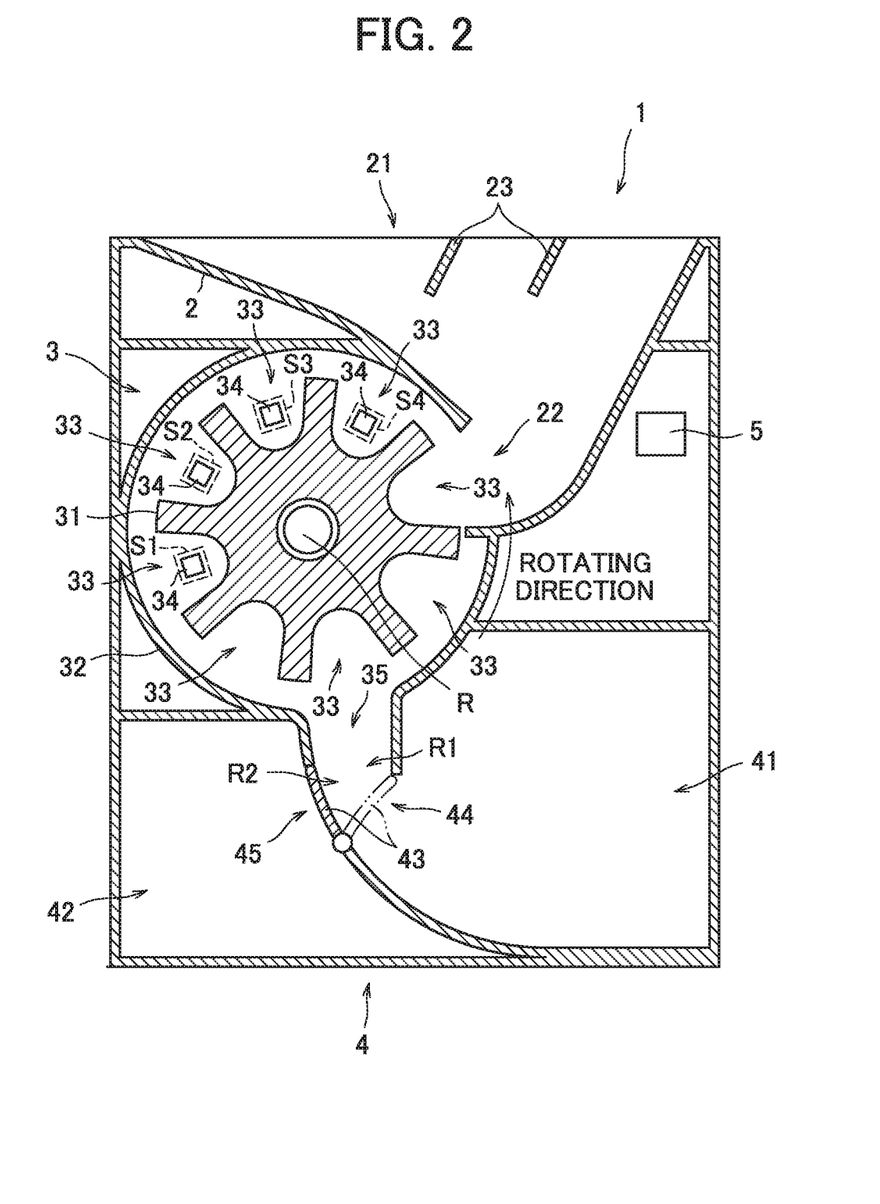
FIG. 2 is a cross-sectional view of the automatic charger taken along the line α-α of FIG. 1.

Hereinafter, description will be made as to an automatic charger according to an embodiment of the present disclosure with reference to the drawings. First, the automatic charger according to the embodiment of the present disclosure will be described with reference to FIG. 1 and FIG. 2. FIG. 1 is an appearance view of an automatic charger 1 according to the present embodiment. FIG. 2 is a cross-sectional view of the automatic charger 1 taken along the line α-α of FIG. 1.

The automatic charger 1 according to the present embodiment executes a charging operation by a charging section 3 to a plurality of batteries thrown inward from a battery throwing section 2, and houses the plurality of batteries in a battery compartment 4. The automatic charger 1 distinguishes a first battery satisfying predetermined charging properties, and a second battery other than the first battery. Furthermore, the automatic charger 1 separately houses the first battery and the second battery in the battery compartment 4, in accordance with a distinguishing result of each of the plurality of batteries.

Here, the first battery in the present embodiment is a chargeable battery, positive use of which is recommended, for example, from viewpoints of energy saving and contribution to environments. Specifically, the first battery is a secondary battery that is a battery having a charge upper limit voltage, a charge/discharge efficiency, and a maximum charge/discharge current that are equal to or more than predetermined threshold values. Note that in the automatic charger 1 according to the present embodiment, it is determined whether or not the first battery is the secondary battery that has the charge upper limit voltage, the charge/discharge efficiency, and the maximum charge/discharge current that are equal to or more than the predetermined threshold values, in accordance with a result of the charging operation by the charging section 3, as described later. Furthermore, in the automatic charger 1 according to the present embodiment, as the threshold value, an objective numerical value is set by which it can be judged that the battery is EOL due to a factor such as long use, or a bad product. Additionally, in the automatic charger 1 according to the present embodiment, an arbitrary numerical value can be set as the threshold value by a user.

Furthermore, the second battery in the present embodiment is a battery having the charge upper limit voltage, the charge/discharge efficiency or the maximum charge/discharge current that is less than the predetermined threshold value. The second battery includes a primary battery and the secondary battery. Here, an example of the primary battery in the present embodiment is a generally known battery such as an alkaline battery or a manganese battery. Furthermore, an example of the secondary battery in the present embodiment is a generally known battery such as a nickel-metal hydride battery or a lithium ion battery. Additionally, the primary battery and the secondary battery in the present embodiment include batteries having various sizes such as an AA size and a AAA size.

Next, respective configurations of the automatic charger 1 according to the present embodiment will be described. The automatic charger 1 according to the present embodiment comprises the battery throwing section 2, the charging section 3, detecting sections S1 to S4, a microcomputer 5, the battery compartment 4, a display unit D, and a switch SW. The battery throwing section 2 has a hopper shape including an inlet portion 21 in an upper part and an outlet portion 22 in a lower part. Furthermore, in the inlet portion 21 of the battery throwing section 2, introduction pieces 23 are provided. The battery throwing section 2 has the hopper shape and includes the introduction pieces 23, so that the plurality of batteries thrown inward from the inlet portion 21 can be introduced to the outlet portion 22 in order while being aligned.

The charging section 3 includes a gear-shaped rotating part 31 that rotates about a rotary shaft R in a predetermined direction, and a housing 32 provided along the rotating part 31, and provided with a battery inlet of the charging section 3 that matches the outlet portion 22 of the battery throwing section 2. The rotary shaft R of the rotating part 31 is connected to an output shaft of an unshown motor (a drive source). The rotating part 31 is rotated about the rotary shaft R in a rotating direction shown in FIG. 2, by an operation of the motor. The rotating part 31 is provided with a plurality of slots 33 via a predetermined space in a circumferential direction of the rotating part 31.

The plurality of slots 33 receive the batteries one by one from the outlet portion 22 of the battery throwing section 2, and lock the batteries, respectively. For example, the slot 33 located in a vicinity of the battery inlet of the charging section 3 receives the battery and locks the battery, and then the rotating part 31 rotates by one slot in the rotating direction shown in FIG. 2. Furthermore, the slot 33 located in the vicinity of the battery inlet of the charging section 3 receives the battery, and locks the battery. These operations are repeated, so that the battery can be locked in each slot 33. The charging section 3 according to the present embodiment is provided with, for example, eight slots 33.

Furthermore, in the charging section 3, a plurality of charging terminals 34 are provided along the plurality of slots 33 provided in the rotating part 31. Each of the charging terminals 34 is a plate-like part formed of a conductive material. The charging terminal 34 is, for example, a metal plate. The charging terminal 34 is fixed and provided at a position through which each slot 33 passes, in a case where the rotating part 31 is rotated in the rotating direction shown in FIG. 2. For example, in a case where the battery locked in the slot 33 is moved to a position at which the charging terminal 34 is provided, the battery is charged by the charging terminal 34.

The charging section 3 automatically discharges the plurality of batteries from a battery outlet 35 of the charging section 3, after end of the charging operation. Note that examples of timing to end the charging operation in the charging section 3 include a case where the charging operation of all batteries that are charge targets ends, and a case where a predetermined time supposed to end charging of all the batteries being charged elapses. Alternatively, the charging section 3 may be triggered by a user's predetermined operation, to discharge the plurality of batteries from the battery outlet 35 of the charging section 3. Specifically, the charging section 3 may be triggered by the operation of the switch SW as described later, to discharge the plurality of batteries from the battery outlet 35 of the charging section 3.

The detecting sections S1 to S4 correspond to and are installed on the charging terminals 34, respectively. Each of the detecting sections S1 to S4 detects a state of each of the plurality of batteries that are targets of the charging operation by the charging section 3. Specifically, the detecting sections S1 to S4 detect capacitances and electric properties of the batteries, respectively. The detecting sections S1 to S4 transmit respective detection results of the plurality of batteries to the microcomputer (a processing unit) 5. Note that installation positions of the detecting sections S1 to S4 are not limited to positions shown in FIG. 2, and the sections may be installed at arbitrary positions. In the automatic charger 1 according to the present embodiment, for example, the charging terminals 34 are provided at four positions, respectively. That is, the automatic charger 1 according to the present embodiment can simultaneously charge four batteries at maximum.

The microcomputer (the processing unit) 5 includes a predetermined processor as a hardware resource. The microcomputer 5 distinguishes the first battery satisfying the predetermined charging properties, and the second battery other than the first battery, based on the respective detection results of the plurality of batteries by the detecting sections S1 to S4. For example, the microcomputer 5 determines at least respective types of batteries, the capacitance of the chargeable battery that is charged, as well as the EOL battery and the bad product, based on the detection results by the detecting sections S1 to S4, and the microcomputer distinguishes the first battery and the second battery based on determination results.

At this time, the microcomputer 5 is triggered by the operation of the switch SW described later, to distinguish the battery satisfying the predetermined charging properties during the operation of the switch SW as the first battery among the plurality of batteries. For example, even during the charging operation, if the battery satisfying the predetermined charging properties during the operation of the switch SW is present among the plurality of batteries, the microcomputer 5 distinguishes the battery as the first battery.

The display unit D displays, for example, a state of each of the plurality of batteries that are the targets of the charging operation by the charging section 3, under control by the microcomputer 5. The display unit D includes a display interface circuit and display equipment. The display interface circuit converts data indicating a display target to a video signal. A display signal is supplied to the display equipment. The display equipment displays the video signal indicating the display target. As the display equipment, for example, a liquid crystal display (LCD), an organic electro luminescence display (OELD) or any other display known in the art is suitably usable.

The switch SW is provided to forcibly discharge the battery locked in each slot 33 of the charging section 3 from the battery outlet 35 of the charging section 3. For the switch SW, a predetermined operation such as depression or rotation can be performed. For example, in a case where the first battery is urgently required, it is supposed that the display unit D displays a notice indicating that the first battery, for which the charging operation is ended, is present. The user operates the switch SW to forcibly discharge the batteries locked in the respective slots 33 of the charging section 3 from the battery outlet 35 of the charging section 3. Consequently, the user can take the first battery from the automatic charger 1, regardless of a state of charge of the second battery.

The battery compartment 4 separately houses the first battery and the second battery based on the distinguishing result of each of the plurality of batteries in the microcomputer 5. For example, the battery compartment 4 includes a first compartment section 41, a second compartment section 42, and a sorting mechanism 43.

The first compartment section 41 houses the first battery. The first compartment section 41 is installed, for example, in a lower part below the charging section 3 in the automatic charger 1 and in a vicinity of a front surface part of the automatic charger 1, to improve ease of removal of the first battery. The second compartment section 42 houses the second battery. The second compartment section 42 is installed, for example, in the lower part below the charging section 3 in the automatic charger 1.

The sorting mechanism 43 guides the first battery from the battery outlet 35 of the charging section 3 to a battery inlet 44 of the first compartment section 41, and guides the second battery from the battery outlet 35 of the charging section 3 to a battery inlet 45 of the second compartment section 42. For example, the sorting mechanism 43 in the present embodiment includes a flap. The flap selects a first path R1 connecting from the battery outlet 35 of the charging section 3 to the battery inlet 44 of the first compartment section 41 as a path to introduce the first battery to the first compartment section 41 in a case of housing the first battery in the first compartment section 41, and that selects a second path R2 connecting from the battery outlet 35 of the charging section 3 to the battery inlet 45 of the second compartment section 42 as a path to introduce the second battery to the second compartment section 42 in a case of housing the second battery in the second compartment section 42.

Note that the battery compartment 4 houses the first battery in the first compartment section 41, and houses the second battery in the second compartment section 42, in accordance with the distinguishing result of each of the plurality of batteries during the operation of the switch SW, in a case where the switch SW is operated by the user.

Figure 3:
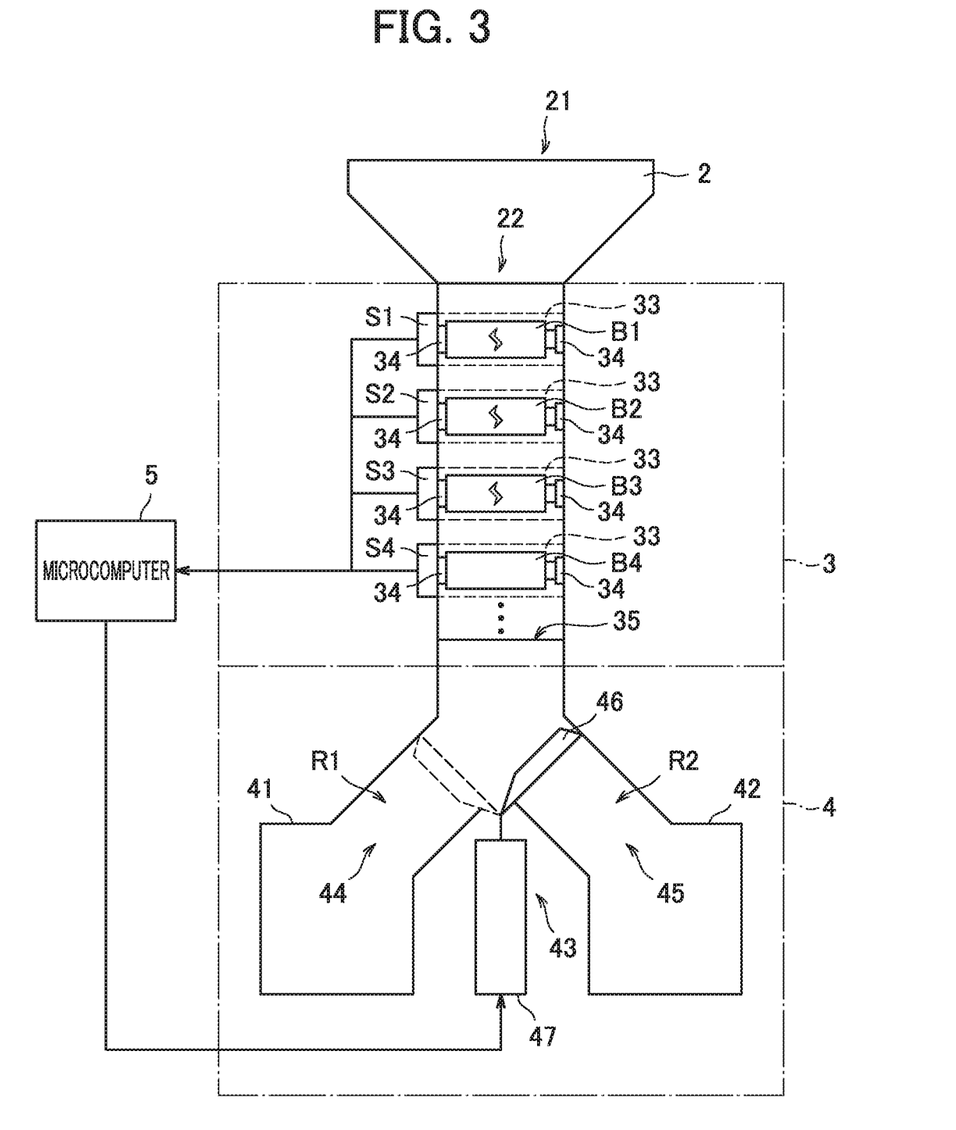
FIG. 3 is a block diagram to explain flow from throwing of a battery to housing of the battery in the automatic charger according to the present embodiment.

Here, flow from the throwing of the battery to the housing of the battery in the automatic charger 1 according to the present embodiment will be described with reference to FIG. 3. FIG. 3 is a block diagram to explain the flow from the throwing of the battery to the housing of the battery in the automatic charger 1 according to the present embodiment. Here, in the present embodiment, description will be made as to a case where four batteries B1 to B4 are thrown into the automatic charger 1.

Note that FIG. 3 illustratively shows the flow from the throwing of the battery to the housing of the battery in the automatic charger 1 according to the present embodiment. Furthermore, to deepen understanding of the automatic charger 1 according to the present embodiment, FIG. 3 partially emphasizes, enlarges, reduces or omits component members that form the automatic charger 1, and does not accurately represent a scale, shape or the like of each of the component members. That is, the scale or shape of the component member shown in FIG. 3 is different from the scale or shape of the component member shown in FIG. 1 and FIG. 2.

First, the user throws the batteries B1 to B4 into the inlet portion 21 of the battery throwing section 2 shown in FIG. 3. The batteries B1 to B4 shown in FIG. 3 have a cylindrical shape. Next, the batteries B1 to B4 thrown into the inlet portion 21 of the battery throwing section 2 are received and locked in the slots 33 of the charging section 3 shown in FIG. 3, respectively. Next, the batteries B1 to B4 locked in the respective slots 33 are moved to the installation positions of the respective charging terminals 34, and the charging operation is started. Note that in the present embodiment, a discharging operation of the batteries B1 to B4 locked in the respective slots 33 is performed, the capacitances of the batteries B1 to B4 are decreased to a predetermined numerical value, and then the charging operation is started. Consequently, even if a fully charged battery is mixed, the capacitance can be decreased by performing the discharging operation. The charging operation can be executed also to the fully charged battery.

Here, the detecting sections S1 to S4 shown in FIG. 3 detect the capacitances and electric properties of the batteries B1 to B4, respectively, and transmit to the microcomputer 5, during the charging operation. Next, the microcomputer 5 determines at least the type of battery B1, the capacitance of the chargeable battery that is charged, as well as the EOL battery and the bad product, based on the detection result by the detecting section S1. Specifically, as the result of the charging operation by the charging terminal 34, a voltage of the battery B1 rises, and hence the microcomputer 5 determines that the battery B1 is the secondary battery. Furthermore, as the result of the charging operation by the charging terminal 34, the charge upper limit voltage, the charge/discharge efficiency and the maximum charge/discharge current of the battery B1 are equal to or more than the predetermined threshold values, and hence the microcomputer 5 determines that the battery B1 is the first battery. That is, the microcomputer 5 distinguishes the battery B1 as the first battery.

The microcomputer 5 determines at least the type of battery B2, the capacitance of the chargeable battery that is charged, as well as the EOL battery and the bad product, based on the detection result by the detecting section S2. Specifically, as the result of the charging operation by the charging terminal 34, a voltage of the battery B2 rises, and hence the microcomputer 5 determines that the battery B2 is the secondary battery. Furthermore, as the result of the charging operation by the charging terminal 34, the charge upper limit voltage, the charge/discharge efficiency and the maximum charge/discharge current of the battery B2 are equal to or more than the predetermined threshold values, and hence the microcomputer 5 determines that the battery B2 is the first battery. That is, the microcomputer 5 distinguishes the battery B2 as the first battery.

The microcomputer 5 determines at least the type of battery B3, the capacitance of the chargeable battery that is charged, as well as the EOL battery and the bad product, based on the detection result by the detecting section S3. Specifically, as the result of the charging operation by the charging terminal 34, a voltage of the battery B3 rises, and hence the microcomputer 5 determines that the battery B3 is the secondary battery. Furthermore, as the result of the charging operation by the charging terminal 34, the charge upper limit voltage, the charge/discharge efficiency and the maximum charge/discharge current of the battery B3 are less than the predetermined threshold values, and hence the microcomputer 5 determines that the battery B3 is the second battery. That is, the microcomputer 5 distinguishes the battery B3 as the second battery.

The microcomputer 5 determines at least the type of battery B4, the capacitance of the chargeable battery that is charged, as well as the EOL battery and the bad product, based on the detection result by the detecting section S4. Specifically, as the result of the charging operation by the charging terminal 34, a voltage of the battery B4 does not rise, and hence the microcomputer 5 determines that the battery B4 is the primary battery. That is, the microcomputer 5 distinguishes the battery B4 as the second battery.

After end of the charging operation in the charging section 3, the charging section 3 discharges the batteries B1 to B4 from the battery outlet 35 of the charging section 3. After the charging section 3 discharges the batteries B1 to B4, the battery compartment 4 houses the first battery in the first compartment section 41, and houses the second battery in the second compartment section 42, based on the distinguishing result of each of the plurality of batteries B1 to B4 in the microcomputer 5.

For example, in a case of housing, in the first compartment section 41, the batteries B1, B2 distinguished as the first battery in the microcomputer 5, the second path R2 is closed by using a flap 46 and an actuator 47 that form the battery compartment 4. The actuator 47 is, for example, a solenoid or a servomotor. An operation of the actuator 47 is controlled by the microcomputer 5. Specifically, in a case where an initial installation position of the flap 46 is a position in a vicinity of the battery inlet 45 of the second compartment section 42 (i.e., the position to close the second path R2) and in a case where the batteries B1, B2 are housed in the first compartment section 41, as shown in FIG. 3, the second path R2 remains to be closed with the flap 46. That is, the microcomputer 5 does not operate the actuator 47. Consequently, the batteries B1, B2 distinguished as the first battery can be housed in the first compartment section 41 via the first path R1.

Furthermore, in a case of housing, in the second compartment section 42, the batteries B3, B4 distinguished as the second battery in the charging section 3, the first path R1 is closed by using the flap 46 and the actuator 47. Specifically, in the case of housing the batteries B3, B4 in the second compartment section 42, as shown in FIG. 3, the first path R1 is closed with the flap 46 at a discharge timing of the batteries B3, B4 from the charging section 3, in accordance with the distinguishing result by the microcomputer 5. That is, the microcomputer 5 controls the operation of the actuator 47 to close the first path R1 with the flap 46. Consequently, the batteries B3, B4 distinguished as the second battery can be housed in the second compartment section 42 via the second path R2. Through the above process, the automatic charger 1 according to the present embodiment can house the first battery in the first compartment section 41, and house the second battery in the second compartment section 42.

SUMMARY

As described above, the automatic charger 1 according to the present embodiment comprises the battery throwing section 2 into which the plurality of batteries are thrown, the charging section 3 that executes the charging operation to the plurality of batteries thrown into the battery throwing section 2, the detecting sections S1 to S4 that detect the respective states of the plurality of batteries that are the targets of the charging operation by the charging section 3, the microcomputer (the processing unit) 5 that distinguishes the first battery satisfying the predetermined charging properties, and the second battery other than the first battery, based on the detection result of each of the plurality of batteries by the detecting sections S1 to S4, and the battery compartment 4 including the first compartment section 41 that houses the first battery, the second compartment section 42 that houses the second battery, and the sorting mechanism 43 that introduces the first battery to the first compartment section 41, and introduces the second battery to the second compartment section 42, in accordance with the distinguishing result of each of the plurality of batteries in the microcomputer 5. The sorting mechanism 43 includes the flap 46 that selects the first path R1 connecting from the battery outlet 35 of the charging section 3 to the battery inlet 44 of the first compartment section 41 as the path to introduce the first battery to the first compartment section 41 in the case of housing the first battery in the first compartment section 41, and that selects the second path R2 connecting from the battery outlet 35 of the charging section 3 to the battery inlet 45 of the second compartment section 42 as the path to introduce the second battery to the second compartment section 42 in the case of housing the second battery in the second compartment section 42.

According to the above configuration, the microcomputer 5 of the automatic charger 1 according to the present embodiment distinguishes the first battery and the second battery. Furthermore, the battery compartment 4 houses the first battery in the first compartment section 41, and houses the second battery in the second compartment section 42, in accordance with the distinguishing result of each of the plurality of batteries in the microcomputer 5. Consequently, the automatic charger 1 according to the present embodiment can automatically distinguish the first battery and the second battery, and separately house the first battery and the second battery.

Thus, the automatic charger 1 according to the present embodiment can prevent the first battery and the second battery, distinguished in terms of charging possibilities and good or bad properties, from being mixed and housed, and can sort the batteries without relying on user's judgment. Furthermore, the automatic charger 1 according to the present embodiment separately houses the first battery and the second battery, and hence a user side does not have to sort the batteries, which can improve user's convenience. Furthermore, since the automatic charger 1 according to the present embodiment separately houses the first battery and the second battery, misuse of the batteries is eliminated. Additionally, the automatic charger 1 according to the present embodiment separately houses the first battery and the second battery, which can encourage, for example, positive use of the first battery. This can increase use frequency of the first battery, save energy and also contribute to environments.

Note that in the automatic charger 1 according to the above embodiment, as shown in FIG. 3, in the case where the initial installation position of the flap 46 is the position in the vicinity of the battery inlet 45 of the second compartment section 42 (i.e., the position to close the second path R2) and in the case where the batteries B1, B2 are housed in the first compartment section 41, the second path R2 remains to be closed with the flap 46. Furthermore, in the automatic charger 1 according to the above embodiment, in the case of housing the batteries B3, B4 in the second compartment section 42, the first path R1 is closed with the flap 46 at the discharge timing of the batteries B3, B4 from the charging section 3, in accordance with the distinguishing result by the microcomputer 5. However, the automatic charger 1 according to the present embodiment is not limited to this example.

For example, in the present embodiment, the initial installation position of the flap 46 is not set. The microcomputer 5 in the above embodiment controls the operation of the actuator 47 to close the second path R2 with the flap 46, in the case of housing the batteries B1, B2 in the first compartment section 41. Furthermore, the microcomputer 5 in the embodiment controls the operation of the actuator 47 to close the first path R1 with the flap 46, in the case of housing the batteries B3, B4 in the second compartment section 42. Specifically, in the case of housing the batteries B1, B2 in the first compartment section 41, the second path R2 is closed with the flap 46 at the discharge timing of the batteries B1, B2 from the charging section 3, in accordance with a sorting result by the microcomputer 5. At this time, the microcomputer 5 controls the operation of the actuator 47 to close the second path R2 with the flap 46. Consequently, the automatic charger 1 according to the present embodiment can house the batteries B1, B2 distinguished as the first battery in the first compartment section 41 via the first path R1.

Additionally, in the case of housing the batteries B3, B4 in the second compartment section 42, the first path R1 is closed with the flap 46 at the discharge timing of the batteries B3, B4 from the charging section 3, in accordance with the distinguishing result by the microcomputer 5. At this time, the microcomputer 5 controls the operation of the actuator 47 to close the first path R1 with the flap 46. Consequently, the automatic charger 1 according to the present embodiment can house the batteries B3, B4 distinguished as the second battery in the second compartment section 42 via the second path R2.

Furthermore, the detecting sections S1 to S4 shown in FIG. 3 detect the capacitances and electric properties of the batteries B1 to B4, respectively, and transmit to the microcomputer 5, during the charging operation. Additionally, the microcomputer 5 determines at least the types of batteries B1 to B4, the capacitance of the chargeable battery that is charged, as well as the EOL battery and the bad product, based on the detection results by the detecting sections S1 to S4. However, the automatic charger 1 according to the present embodiment is not limited to this example. For example, the detecting sections S1 to S4 of the automatic charger 1 according to the present embodiment may detect the capacitances and electric properties of the batteries B1 to B4, and transmit to the microcomputer 5, during the discharging operation to be executed prior to the charging operation. Additionally, the microcomputer 5 may determine at least the types of batteries B1 to B4, the capacitance of the chargeable battery that is charged, as well as the EOL battery and the bad product, based on the detection results by the detecting sections S1 to S4. Consequently, the automatic charger 1 according to the present embodiment can accurately detect the capacitances and electric properties of the batteries B1 to B4. Furthermore, at least the types of batteries B1 to B4, the capacitance of the chargeable battery that is charged, as well as the EOL battery and the bad product can be determined based on the detection results during the discharging operation and the charging operation, which are obtained by the detecting sections S1 to S4, and hence reliability of the determination result can improve.

Furthermore, wording "the predetermined processor" used in the above description means, for example, a central processing unit (CPU) for exclusive or general use, and a micro processing unit (MPU), as well as an application specific integrated circuit (ASIC), a programmable logic device (e.g., a simple programmable logic device (SPLD), and a complex programmable logic device (CPLD)), and a field programmable gate array (FPGA). Additionally, each component (each processing unit) of the present embodiment is not limited to a single processor, and may be achieved by a plurality of processors. Furthermore, a plurality of components (a plurality of processing units) may be achieved by the single processor.

(Modification)

The automatic charger 1 according to the present embodiment distinguishes the first battery satisfying the predetermined charging properties, and the second battery other than the first battery. However, the automatic charger 1 according to the present embodiment is not limited to this example. For example, the automatic charger 1 according to a modification may more finely distinguish the plurality of batteries thrown into the battery throwing section 2. Specifically, in the automatic charger 1 according to the modification, the first compartment section 41 is divided into a plurality of sections. Furthermore, the first path R1 is provided with branch paths for the first compartment section 41 divided into the plurality of sections. Additionally, a flip and an actuator are provided between a main path and each branch path of the first path R1. Note that an operation of the newly installed actuator is controlled by the microcomputer 5. Consequently, for example, in a case where the first battery includes batteries having various sizes such as the AA size and the AAA size, the microcomputer 5 of the charging section 3 distinguishes the first battery for each battery size, and the battery compartment 4 can house the first battery having each of the various sizes.

Furthermore, in the automatic charger 1 according to the modification, the second compartment section 42 is divided into a plurality of sections. Furthermore, the second path R2 is provided with branch paths for the second compartment section 42 divided into the plurality of sections. Additionally, a flip and an actuator are provided between a main path and each branch path of the second path R2. Note that an operation of the newly installed actuator is controlled by the microcomputer 5. Consequently, for example, in a case where the second battery includes various types of batteries, batteries of various sizes, as well as an EOL battery, or a bad product, the microcomputer 5 of the charging section 3 distinguishes the second battery for each of the various types of batteries, the batteries of various sizes, as well as the EOL battery, or the bad product, and the battery compartment 4 can house the second battery of each of the various types of batteries, the batteries of various sizes, as well as the EOL battery, and the bad product.

Embodiments of Disclosure

An automatic charger according to a first embodiment of the present disclosure comprises a battery throwing section into which a plurality of batteries are thrown, a charging section that executes a charging operation to the plurality of batteries thrown into the battery throwing section, a detecting section that detects a state of each of the plurality of batteries that are targets of the charging operation by the charging section, a processing unit that distinguishes a first battery satisfying predetermined charging properties, and a second battery other than the first battery, based on a detection result of each of the plurality of batteries by the detecting section, and a battery compartment including a first compartment section that houses the first battery, a second compartment section that houses the second battery, and a sorting mechanism that introduces the first battery to the first compartment section, and introduces the second battery to the second compartment section, in accordance with a distinguishing result of each of the plurality of batteries in the processing unit, wherein the sorting mechanism includes a flap that selects a first path connecting from a battery outlet of the charging section to a battery inlet of the first compartment section as a path to introduce the first battery to the first compartment section in a case of housing the first battery in the first compartment section, and that selects a second path connecting from the battery outlet of the charging section to a battery inlet of the second compartment section as a path to introduce the second battery to the second compartment section in a case of housing the second battery in the second compartment section.

According to an automatic charger of a second embodiment of the present disclosure, in the automatic charger according to the first embodiment, the processing unit determines at least a type of each of the plurality of batteries, a capacitance of a chargeable battery that is charged among the plurality of batteries, as well as an EOL battery and a bad product, based on the detection result by the detecting section, and distinguishes the first battery and the second battery, in accordance with a determination result.

According to an automatic charger of a third embodiment of the present disclosure, in the automatic charger according to the first or second embodiment, the flap is installed at a position to close the second path, in advance, and closes the first path in the case of housing the second battery in the second compartment section.

According to an automatic charger of a fourth embodiment of the present disclosure, in the automatic charger according to the first or second embodiment, the flap closes the second path in the case of housing the first battery in the first compartment section, and closes the first path in the case of housing the second battery in the second compartment section.

According to an automatic charger of a fifth embodiment of the present disclosure, in the automatic charger according to any one of the first to fourth embodiments, the charging section executes a discharging operation to the plurality of batteries, prior to the execution of the charging operation to the plurality of batteries.

According to an automatic charger of a sixth embodiment of the present disclosure, the automatic charger according to any one of the first to fifth embodiments further comprises a switch, wherein the charging section is triggered by an operation of the switch to discharge the plurality of batteries, the processing unit distinguishes a battery satisfying predetermined charging properties during the operation of the switch as the first battery among the plurality of batteries, and the battery compartment houses the first battery in the first compartment section, and houses the second battery in the second compartment section, in accordance with a distinguishing result of each of the plurality of batteries during the operation of the switch.

According to an automatic charger of a seventh embodiment of the present disclosure, the automatic charger according to any one of the first to sixth embodiments further comprises a display unit that displays a state of each of the plurality of batteries that are the targets of the charging operation by the charging section.

EXPLANATION OF REFERENCE SIGNS

1 automatic charger
2 battery throwing section
3 charging section
4 battery compartment
5 microcomputer (a processing unit)
31 rotating part
32 housing
33 slot
34 charging terminal
41 first compartment section
42 second compartment section
43 sorting mechanism
46 flap
47 actuator
B1 to B4 battery
D display unit
S1 to S4 detecting section
SW switch

What is claimed is:
1. An automatic charger comprising:
a battery throwing section into which a plurality of batteries are thrown;
a charging section that executes a charging operation to the plurality of batteries thrown into the battery throwing section;
a detecting section that detects a state of each of the plurality of batteries that are targets of the charging operation by the charging section;
a processing unit that distinguishes, among the plurality of batteries, between a first battery satisfying predetermined charging properties, and a second battery other than the first battery, based on a detection result of each of the plurality of batteries by the detecting section; and a battery compartment including a first compartment section that houses the first battery, a second compartment section that houses the second battery, and a sorting mechanism that introduces the first battery to the first compartment section, and introduces the second battery to the second compartment section, in accordance with a distinguishing result of each of the plurality of batteries in the processing unit, wherein the sorting mechanism includes a flap that selects a first path connecting from a battery outlet of the charging section to a battery inlet of the first compartment section as a path to introduce the first battery to the first compartment section in order to house the first battery in the first compartment section, and that selects a second path connecting from the battery outlet of the charging section to a battery inlet of the second compartment section as a path to introduce the second battery to the second compartment section in order to house the second battery in the second compartment section.

2. The automatic charger according to claim 1, wherein the processing unit determines at least a type of each of the plurality of batteries, a capacitance of a chargeable battery that is charged among the plurality of batteries, as well as an end-of-life(EOL) battery and a bad product, based on the detection result by the detecting section, and distinguishes the first battery and the second battery, in accordance with a determination result.

3. The automatic charger according to claim 1, wherein the flap is installed at a position to close the second path, in advance, and closes the first path in order to house the second battery in the second compartment section.

4. The automatic charger according to claim 1, wherein the flap closes the second path in order to house the first battery in the first compartment section, and closes the first path in order to house the second battery in the second compartment section.

5. The automatic charger according to claim 1, wherein the charging section executes a discharging operation to the plurality of batteries, prior to the execution of the charging operation to the plurality of batteries.

6. The automatic charger according to claim 1, further comprising a switch, wherein the charging section is triggered by an operation of the switch to discharge the plurality of batteries, the processing unit distinguishes a battery satisfying predetermined charging properties during the operation of the switch as the first battery among the plurality of batteries, and the battery compartment houses the first battery in the first compartment section, and houses the second battery in the second compartment section, in accordance with a distinguishing result of each of the plurality of batteries during the operation of the switch.

7. The automatic charger according to claim 1, further comprising a display unit that displays a state of each of the plurality of batteries that are the targets of the charging operation by the charging section.

* * * * *